US009916996B2

(12) United States Patent
Yamada et al.

(10) Patent No.: US 9,916,996 B2
(45) Date of Patent: Mar. 13, 2018

(54) VAPOR PHASE GROWTH METHOD OF GROWING A FILM ON A SUBSTRATE WHILE HEATING THE SUBSTRATE WITH A HEATING UNIT

(71) Applicant: NUFLARE TECHNOLOGY, INC., Yokohama-shi (JP)

(72) Inventors: Takumi Yamada, Yokohama (JP); Takanori Hayano, Yokohama (JP); Tatsuhiko Iijima, Numazu (JP); Yuusuke Sato, Bunkyo (JP)

(73) Assignee: NuFlare Technology Inc., Yokohama-shi (JP)

( * ) Notice: Subject to any disclaimer, the term of this patent is extended or adjusted under 35 U.S.C. 154(b) by 146 days.

(21) Appl. No.: 14/707,461

(22) Filed: May 8, 2015

(65) Prior Publication Data
US 2015/0325488 A1  Nov. 12, 2015

(30) Foreign Application Priority Data

May 12, 2014  (JP) .................................. 2014-098901

(51) Int. Cl.
   *C30B 25/16*  (2006.01)
   *H01L 21/67*  (2006.01)
   (Continued)

(52) U.S. Cl.
   CPC ...... *H01L 21/67248* (2013.01); *C23C 16/303* (2013.01); *C23C 16/46* (2013.01);
   (Continued)

(58) Field of Classification Search
   CPC ......... C30B 25/00; C30B 25/02; C30B 25/10; C30B 25/16; C30B 29/00; C30B 29/10;
   (Continued)

(56) References Cited

U.S. PATENT DOCUMENTS

| 4,493,142 A * | 1/1985 | Hwang ................... C30B 23/02 117/105 |
| 2003/0040198 A1* | 2/2003 | Nakano ............. H01L 21/67248 438/795 |

FOREIGN PATENT DOCUMENTS

| JP | H07-078772 A | 3/1995 |
| JP | H11-140651 | 5/1999 |

(Continued)

OTHER PUBLICATIONS

Combined Office Action and Search Report dated Sep. 7, 2016 in Taiwanese Patent Application No. 104114520 (with English language translation).

(Continued)

*Primary Examiner* — Kenneth A Bratland, Jr.
(74) *Attorney, Agent, or Firm* — Oblon, McClelland, Maier & Neustadt, L.L.P.

(57) ABSTRACT

A vapor phase growth method of growing a film on a substrate by supplying material gases to the substrate while heating the substrate with a heating unit according to an embodiment, the method includes: measuring a temperature of the substrate with a radiation thermometer; executing a temperature feedback control to control an output of the heating unit to cause a measurement value of the radiation thermometer to have a set value when a film is not grown on the substrate; and executing a constant output control to maintain an output of the heating unit constant when a film causing thin-film interference in a wavelength measured by the radiation thermometer is grown on the substrate.

5 Claims, 2 Drawing Sheets

(51) Int. Cl.
  *H01L 21/66* (2006.01)
  *H01L 21/02* (2006.01)
  *H01L 33/00* (2010.01)
  *C23C 16/52* (2006.01)
  *C23C 16/46* (2006.01)
  *C23C 16/30* (2006.01)
  *C30B 29/40* (2006.01)
  *H01L 33/12* (2010.01)

(52) U.S. Cl.
  CPC .............. *C23C 16/52* (2013.01); *C30B 25/16* (2013.01); *C30B 29/406* (2013.01); *H01L 21/0254* (2013.01); *H01L 21/0262* (2013.01); *H01L 21/02458* (2013.01); *H01L 21/67109* (2013.01); *H01L 22/10* (2013.01); *H01L 22/26* (2013.01); *H01L 33/0075* (2013.01); *H01L 33/007* (2013.01); *H01L 33/12* (2013.01)

(58) Field of Classification Search
  CPC ..... C30B 29/40; C30B 29/403; C30B 29/406; C23C 16/303; C23C 16/46; C23C 16/52; H01L 21/02458; H01L 21/0254; H01L 21/0262; H01L 21/67109; H01L 21/67248; H01L 22/10; H01L 22/26; H01L 33/007; H01L 33/0075; H01L 33/12
  USPC ......... 117/84–86, 88, 93, 98, 102, 105, 107, 117/937, 952
  See application file for complete search history.

(56) References Cited

FOREIGN PATENT DOCUMENTS

JP        2006-090978      4/2006
TW            554438 B     9/2003

OTHER PUBLICATIONS

Notification of Reason for Rejection issued in corresponding Japanese Application No. 2014-098901 dated Oct. 31, 2017 (with English translation).

* cited by examiner

VAPOR PHASE GROWTH METHOD OF GROWING A FILM ON A SUBSTRATE WHILE HEATING THE SUBSTRATE WITH A HEATING UNIT

CROSS REFERENCE TO RELATED APPLICATIONS

This application is based upon and claims the benefit of priority from the prior Japanese Patent Application No. 2014-098901, filed on May 12, 2014, the entire contents of which are incorporated herein by reference.

FIELD

The embodiments of the present invention relate to a vapor phase growth method and a vapor phase growth device.

BACKGROUND

To produce an LED (Light Emitting Diode) or an electronic device with a compound semiconductor such as GaN or SiC, an epitaxial growth technique that enables to grow a monocrystalline thin film on a monocrystalline substrate is used.

In a film formation device used in the epitaxial growth technique, a wafer is, for example, placed inside of a film formation chamber kept at a normal pressure or a reduced pressure. When a gas as a material for film formation is supplied into the film formation chamber while the wafer is heated, a pyrolysis reaction and a hydrogen reduction reaction of the material gas occur on a surface of the wafer, which grows an epitaxial film on the wafer.

To deposit a high-quality film with a uniform thickness and a uniform quality on the wafer, the temperature of the wafer needs to be accurately controlled. For this purpose, the temperature of the wafer is measured using a radiation thermometer and a heating unit is controlled (for example, see JP-A 2006-90978).

However, if a thin film that is transparent to a wavelength measured by the radiation thermometer is deposited on the wafer, the emissivity of the measurement wavelength of the radiation thermometer changes due to thin-film interference of the thin film. A temperature detected by the radiation thermometer thus changes depending on the film thickness even when the wafer temperature is constant, which prevents the wafer temperature from being measured accurately. Accordingly, a temperature feedback control to control a heater output based on the detected wafer temperature cannot be achieved and thus a control on the wafer temperature is difficult.

An object of the present invention is to provide a vapor phase growth method and a vapor phase growth device capable of executing a high-accuracy temperature control also when a thin film that causes the thin-film interference is deposited on a substrate.

SUMMARY

A vapor phase growth method of growing a film on a substrate by supplying material gases to the substrate while heating the substrate with a heating unit according to an embodiment, the method includes: measuring a temperature of the substrate with a radiation thermometer; executing a first temperature feedback control to control an output of the heating unit, so that a measurement value of the radiation thermometer has a first set value when a film is not grown on the substrate; and executing a first constant output control to maintain an output of the heating unit constant when a first film causing thin-film interference at a measuring wavelength of the radiation thermometer is grown on the substrate.

A vapor phase growth apparatus according to an embodiment includes: a reaction chamber in which a substrate is introduced and a vapor phase growth reaction is performed; a gas supply unit supplying gases into the reaction chamber; a heating unit heating the substrate; a radiation thermometer measuring a temperature of the substrate; and a control unit controlling an output of the heating unit, wherein the control unit executes a first temperature feedback control to control an output of the heating unit, so that a measurement value of the radiation thermometer has a first set value and so that a first constant output control maintains an output of the heating unit constant when a first film causing thin-film interference in a wavelength measured by the radiation thermometer is grown on the substrate.

DETAILED DESCRIPTION

Embodiments will now be explained with reference to the accompanying drawings. The present invention is not limited to the embodiments.

Figure 1:
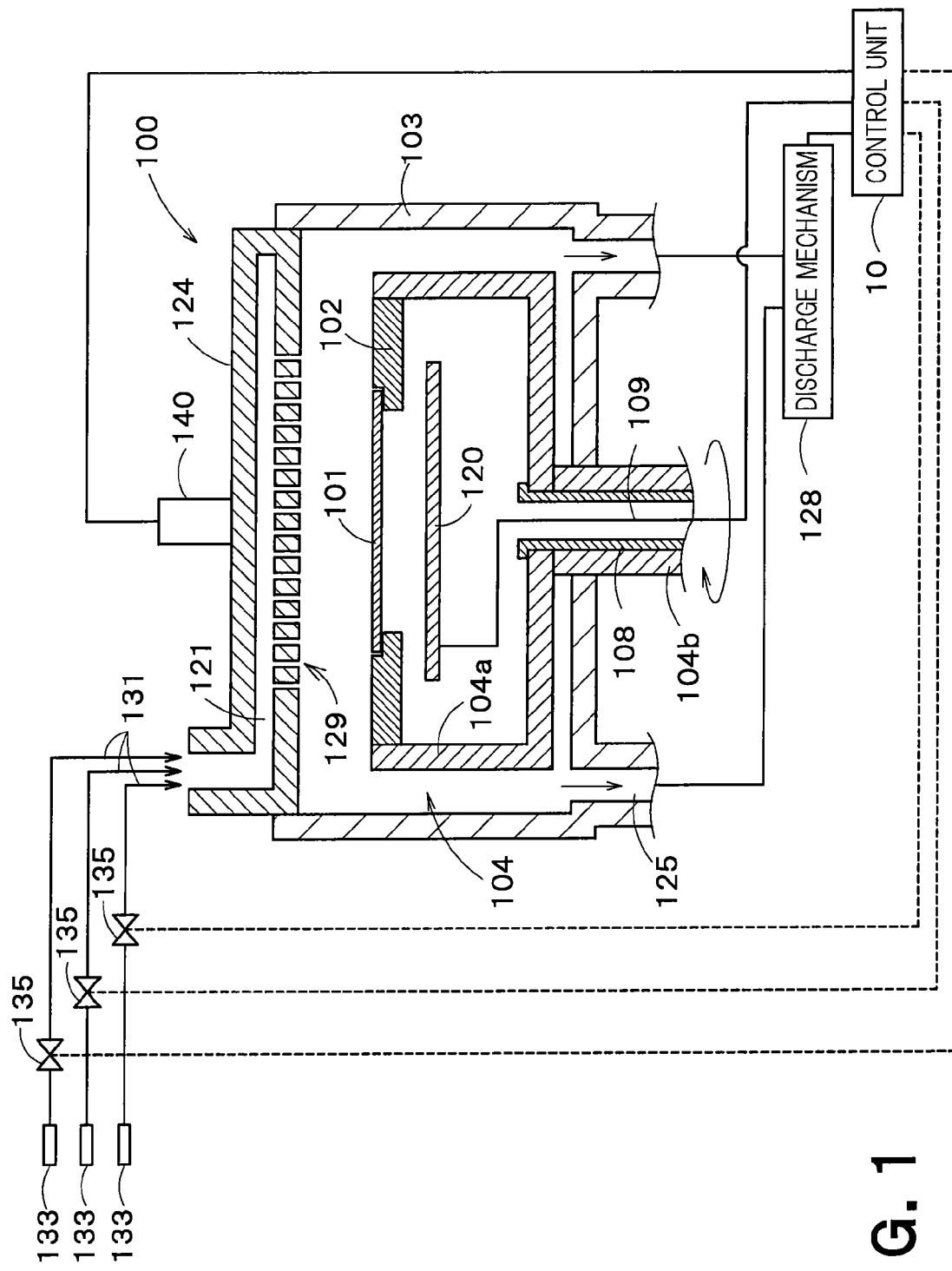
FIG. 1 shows a schematic configuration of a vapor phase growth apparatus 100 according to an embodiment.

FIG. 1 shows a schematic configuration of a vapor phase growth device 100 according to an embodiment. In the present embodiment, a substrate 101 such as a silicon wafer is used as a sample of a film formation processing target. FIG. 1 shows a state where the substrate 101 is placed on a susceptor 102. Plural types of material gases as materials for forming an epitaxial film are supplied onto the substrate 101 placed on the susceptor 102 to cause a vapor-phase growth reaction on the substrate 101 to perform film formation.

The vapor phase growth device 100 includes a chamber 103 as a reaction chamber in which vapor phase growth is caused on the substrate 101 to form an epitaxial film.

Inside of the chamber 103, the susceptor 102 is provided in an upper part of a rotating unit 104. The susceptor 102 has a ring shape configured to have an opened part. A bore is provided on an inner circumferential side of the susceptor 102 and the susceptor 102 has a structure to receive an outer circumferential part of the substrate 101 within the bore to support the substrate 101. Because being exposed to a high temperature, the susceptor 102 is configured, for example, by coating a surface of isotropic graphite with a high-heatproof and high-purity SiC according to a CVD (Chemical Vapor Deposition) method.

The susceptor 102 shown in FIG. 1 is only an example and the structure of the susceptor 102 is not limited thereto. For example, a susceptor configured to have a member that closes the opened part can be used instead.

The rotation unit 104 includes a cylindrical part 104a and a rotation shaft 104b. The rotation unit 104 supports the susceptor 102 in an upper part of the cylindrical part 104a. As the rotation shaft 104b is rotated by a motor (not shown), the susceptor 102 is rotated via the cylindrical part 104a. In this manner, when the substrate 101 is placed on the susceptor 102, the substrate 101 can be rotated.

In FIG. 1, the cylindrical part 104a has a structure having an opened part in an upper part and is opened in the upper part.

Inside of the cylindrical part 104a, a heater 120 as a heating unit is provided. A resistance heating heater can be used as the heater 120, which is configured by coating a surface of a carbon (C) material with a high-heatproof SiC, for example. The heater 120 is supplied with power by a wire 109 that passes through the inside of a substantially-cylindrical quartz shaft 108 provided inside of the rotating shaft 104b and heats the substrate 101 on the back side. The wire 109 is connected to a control unit 10, and the control unit 10 controls an output (heating power) of the heater 120. As the heating unit, a heating lamp or the like can be used instead of the heater 120.

An elevation pin (not shown) is arranged in the shaft 108, as a substrate elevation unit. A lower end of the elevation pin is extended to an elevation device (not shown) provided in a lower part of the shaft 108. With this configuration, the elevation pin can be lifted and lowered by operating the elevation device. The elevation pin is used when the substrate 101 is transported inside the chamber 103 and when the substrate 101 is transported outside the chamber 103. The elevation pin supports from below and lifts the substrate 101 to be separated from the susceptor 102. It is operated that the substrate 101 is held at a predetermined position away from and above the susceptor 102 located on the rotating unit 104 such that the substrate 101 can be transported and received between the chamber 103 and a transportation robot (not shown).

A shower plate 124 is provided in an upper part of the chamber 103 of the vapor phase growth device 100. The shower plate 124 functions to rectify flows of the plural types of material gases for forming an epitaxial film in the chamber 103 and to supply the material gases like a shower toward the surface of the substrate 101 through gas injection holes 129.

The shower plate 124 has a plate-like shape with a predetermined thickness. The shower plate 124 can be formed of a metal material such as stainless steel or an aluminum alloy. Inside of the shower plate 124, a gas passage is provided to mix the plural types of gases and to supply the mixed gas to the substrate 101 in the chamber 103. The shower plate 124 has a quartz window (not shown) through which a temperature measurement explained later is performed. A plurality of gas passages can be provided in the shower plate 124 to supply the plural types of gases to the substrate 101 in the chamber 103 while kept separated from each other.

Each of the gas passages 121 is connected to one end of a gas pipe 131. The other end of the gas pipe 131 is connected to a gas supply unit 133 configured of a gas cylinder or the like, which allows a gas to flow at a flow rate corresponding to an opening degree of a gas valve 135. The opening degree of the gas valve 135 is controlled by the control unit 10. A plurality of the gas pipes 131 and a plurality of the gas supply units 133 are provided to correspond to the different gases, respectively.

Under the chamber 103, a plurality of gas discharge units 125 for discharging the plural types of gases after reacted and the like are provided. The gas discharge units 125 are connected to a discharge mechanism 128 including an adjustment valve, a vacuum pump, and the like.

A radiation thermometer 140 as a temperature measurement unit is provided on the chamber 103. The radiation thermometer 140 measures a surface temperature of the substrate 101 through the quartz window (not shown) provided in the shower plate 124 and a quartz window (not shown) provided in the gas injection holes 129. A result of the measurement performed by the radiation thermometer 140 is transmitted to the control unit 10. While 90 nanometers is selected, for example, as a wavelength to be measured by the radiation thermometer 140, other wavelengths such as those of infrared rays or visible rays can be selected instead.

The control unit 10 is connected to the gas valves 135 and controls supply amounts of the gases and supply timings thereof. The control unit 10 is connected also to the discharge mechanism 128 and adjusts the inside of the chamber 103 to a desired pressure. The control unit 10 also obtains the surface temperature of the substrate 101 measured by the radiation thermometer 140. The control unit 10 also executes a drive control on the rotating unit 104.

The control unit 10 also controls the output of the heater 120. The control unit 10 has two output control methods including a "temperature feedback control" to control the output of the heater 120 to cause the measurement result of the radiation thermometer 140 to have a predetermined value and a "constant output control" to maintain the output of the heater 120 constant regardless of the measurement result of the radiation thermometer 140. The film formation on the substrate 101 is performed while the control unit 10 switches the control between these two output control methods.

When a thin film is deposited on the substrate 101, interference colors are produced in some thicknesses of the thin film and thus the emissivity is changed, which may reduce the accuracy in the measurement result of the radiation thermometer 140. Accordingly, in the present embodiment, when the accuracy in the measurement result of the radiation thermometer 140 is possibly reduced, that is, during deposition of a film on the substrate 101, the control unit 10 executes the "constant output control" to maintain the output of the heater 120 constant without using the measurement result of the radiation thermometer 140.

Figure 2:
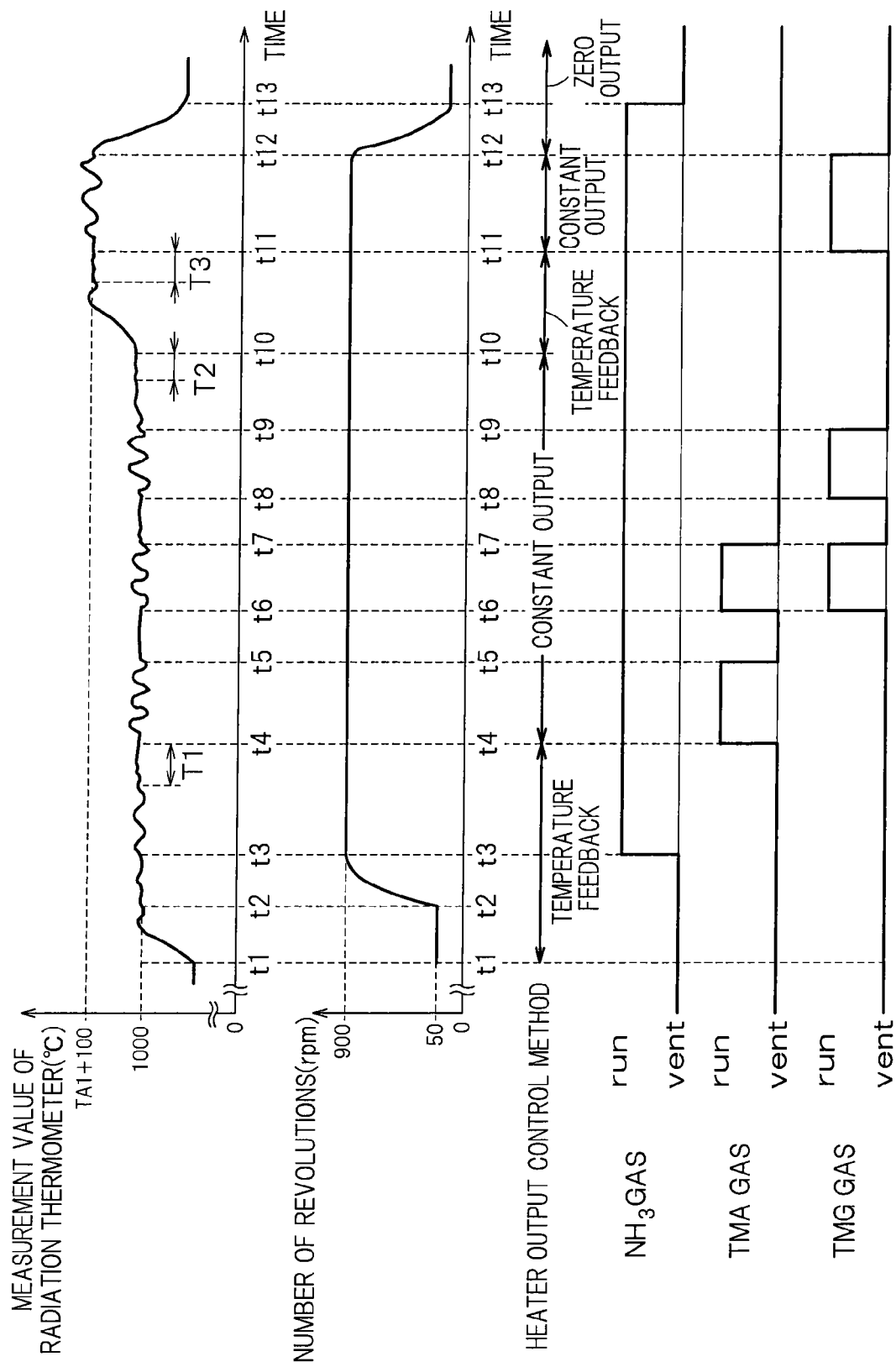
FIG. 2 is a timing chart showing a method of vapor phase growth method according to an embodiment.

An example of a method of forming a film while switching the output control method of the heater 120 is explained next with reference to a timing chart of FIG. 2. FIG. 2 shows an example of depositing a group-III nitride film on the substrate 101, in which an ammonia gas (hereinafter, "NH$_3$ gas"), a trimethylaluminium gas (hereinafter, "TMA gas"), and a trimethylgallium gas (hereinafter, "TMG gas") are supplied from the gas supply units 133 (see FIG. 1), respectively.

As shown in FIG. 2, between times t1 and t2, the control unit 10 executes the temperature feedback control to control the output of the heater 120 based on the measurement result of the radiation thermometer 140 to cause the temperature of the substrate 101 to be 1000° C. At that time, the number of revolutions of the rotating unit 104 is 50 rmp and the NH$_3$ gas, the TMA gas, and the TMG gas are not supplied. In FIG. 2, "vent" indicates that a gas is not supplied into the chamber 103 and "run" indicates that a gas is supplied into the chamber 103.

Between times t2 and t3, the number of revolutions of the rotating unit 104 is increased to 900 rpm. At that time, the control unit 10 executes the temperature feedback control to control the output of the heater 120 based on the measurement result of the radiation thermometer 140 to keep the temperature of the substrate 101 at 1000° C. When the temperature of the substrate 101 changes due to a change in the number of revolutions of the rotating unit 104, this change in the temperature is accurately detected by the radiation thermometer 140. The control unit 10 can control the output of the heater 120 using the measurement result of the radiation thermometer 140 and can maintain the temperature of the substrate 101 at the predetermined value (1000° C.).

At the time t3, supply of the NH$_3$ gas into the chamber 103 is started. At that time, the control unit 10 executes the temperature feedback control to control the output of the heater 120 based on the measurement result of the radiation thermometer 140 to keep the temperature of the substrate 101 at 1000° C. When the temperature of the substrate 101 changes with the supply of the NH$_3$ gas, this change in the temperature is accurately detected by the radiation thermometer 140. The control unit 10 can control the output of the heater 120 using the measurement result of the radiation thermometer 140 and can maintain the temperature of the substrate 101 at the predetermined value (1000° C.).

When the measurement result of the radiation thermometer 140 is stabilized by the temperature feedback control after start of the supply of the NH$_3$ gas, the control unit 10 calculates an average value PA1 of the outputs of the heater 120 during a predetermined time (a period T1 in FIG. 2, for example). The calculated output average value PA1 of the heater 120 can be regarded as an output of the heater 120 that enables the temperature of the substrate 101 to be maintained at a predetermined temperature (1000° C.) in a state where the NH$_3$ gas is supplied (hereinafter, "NH$_3$-gas supply state"). The period T1 is several tens of seconds, for example.

At a time t4, supply of the TMA gas into the chamber 103 is started. At that time, the control unit 10 switches over the output control method of the heater 120 to the constant output control to maintain the output of the heater 120 at the calculated average value PA1. With the supply of the TMA gas, an aluminum nitride film is deposited on the substrate 101.

The emissivity of the wavelength (900 nanometers, for example) measured by the radiation thermometer 140 changes due to occurrence of thin-film interference in some film thicknesses of the aluminum nitride film on the substrate 101 and thus the temperature detected by the radiation thermometer 140 may change despite the fact that the temperature of the substrate 101 does not actually change. In the present embodiment, the control unit 10 executes the constant output control and keeps the output of the heater 120 constant even when the measurement result of the radiation thermometer 140 changes, whereby the temperature of the substrate 101 can be maintained substantially at the predetermined value. When heat release caused by radiation from the substrate 101 changes due to the thin-film interference, the temperature of the substrate 101 changes to some extent. However, this change in the temperature is much smaller than a temperature change produced by an emissivity change of the wavelength measured by the radiation thermometer 140.

At a time t5, the supply of the TMA gas is stopped and the TMA gas is purged from the chamber 103. The control unit 10 executes the constant output control to maintain the output of the heater 120 at the value PA1.

At a time t6, supply of the TMA gas and the TMG gas is started. The control unit 10 executes the constant output control to maintain the output of the heater 120 at the value PA1. With the supply of the TMA gas and the TMG gas, an aluminum gallium nitride film is deposited on the substrate 101. In some film thicknesses of the aluminum gallium nitride film on the substrate 101, thin-film interference occurs and thus the emissivity of the wavelength measured by the radiation thermometer 140 changes, which may change the detection temperature of the radiation thermometer 140 despite the fact that the temperature of the substrate 101 does not actually change. However, because the control unit 10 executes the constant output control, the output of the heater 120 is kept constant even when the measurement result of the radiation thermometer 140 changes, and accordingly the temperature of the substrate 101 can be maintained at the predetermined value.

At a time t7, the supply of the TMA gas and the TMG gas is stopped and the TMA gas and the TMG gas are purged from the chamber 103. The control unit 10 executes the constant output control to maintain the output of the heater 120 at the value PA1.

At a time t8, supply of the TMG gas is started. The control unit 10 executes the constant output control to maintain the output of the heater 120 at the value PA1. With the supply of the TMG gas, a gallium nitride film is deposited on the substrate 101. In some film thicknesses of the gallium nitride film on the substrate 101, thin-film interference occurs and thus the emissivity of the wavelength measured by the radiation thermometer 140 changes, which may change the detection temperature of the radiation thermometer 140 despite the fact that the temperature of the substrate 101 does not actually change. However, because the control unit 10 executes the constant output control, the output of the heater 120 is kept constant even when the measurement result of the radiation thermometer 140 changes, and accordingly the temperature of the substrate 101 can be maintained at a predetermined value.

At a time t9, the supply of the TMG gas is stopped and the TMG gas is purged from the chamber 103. The control unit 10 executes the constant output control to maintain the output of the heater 120 at the value PA1.

A temperature TA1 indicated by the radiation thermometer 140 at the time t9 is recorded in a recording device of the control unit 10. The indicated temperature TA1 of the radiation thermometer 140 at the time t9 may be different from the predetermined set temperature (1000° C.) in some cases. The reason is as follows. Because, when the aluminum nitride film, the aluminum gallium nitride film, or the gallium nitride film transmits light of the wavelength measured by the radiation thermometer 140, for example, the wavelength of 900 nanometers, the light reflects on the surface or an interfacial surface thereof and accordingly thin-film interference is caused by deposition of these films and affects the measurement of the radiation thermometer 140. Because the control unit 10 executes the constant output control and keeps the output of the heater 120 constant after the time t4, the indicated temperature TA1 of the radiation thermometer 140 at the time t9 can be deemed to correspond to the predetermined set temperature (1000° C.). When the measurement result of the radiation thermometer 140 stabilizes after purging of the TMG gas, the control unit 10 can calculate an average value of the measurement results of the radiation thermometer 140 during a predetermined time (a period T2 in FIG. 2, for example) to be used as the value TA1. The period T2 is several tens of seconds, for example.

At a time t10, the control unit 10 switches over the output control method of the heater 120 to the temperature feedback control. The control unit 10 then controls the output of the heater 120 based on the measurement result of the radiation thermometer 140 to cause the temperature of the substrate 101 to be 1100° C. Specifically, the control unit 10 controls the output of the heater 120 to cause the measurement result of the radiation thermometer 140 to have a value of (the indicated temperature TA1 of the radiation thermometer 140 at the time t9+100° C.). Even when there is an error in the absolute value of the measurement value of the radiation thermometer 140 due to film formation, a variation in the temperature can be detected accurately. Because the indicated temperature TA1 of the radiation thermometer 140 at the time t9 can be deemed to correspond to 1000° C., the value of (the indicated temperature TA1 of the radiation thermometer 140 at the time t9+100° C.) can be deemed to correspond to the target value of 1100° C.

When the measurement result obtained by the radiation thermometer 140 is stabilized by the temperature feedback control, the control unit 10 calculates an average value PA2 of the outputs of the heater 120 in a predetermined time (a period T3 in FIG. 2, for example). The calculated output average value PA2 of the heater 120 can be regarded as an output of the heater 120 that enables the temperature of the substrate 101 to be kept at a predetermined temperature (1100° C.) in the $NH_3$-gas supply state. The period T3 is several tens of seconds, for example.

At a time t11, supply of the TMG gas into the chamber 103 is started. At that time, the control unit 10 switches over the output control method of the heater 120 to the constant output control to maintain the output of the heater 120 at the calculated average value PA2. With the supply of the TMG gas, a gallium nitride film is deposited on the substrate 101. Depending on the film thickness of the gallium nitride film on the substrate 101, thin-film interference occurs and thus the emissivity of the wavelength measured by the radiation thermometer 140 changes, which may change the detection temperature of the radiation thermometer 140 despite the fact that the temperature of the substrate 101 does not actually change. However, because the control unit 10 executes the constant output control and keep the output of the heater 120 constant even when the measurement result of the radiation thermometer 140 changes, the temperature of the substrate 101 can be maintained at a predetermined temperature.

After a predetermined thickness of the gallium nitride film is deposited on the substrate 101, the film formation processing is ended. For example, at a time t12, the supply of the TMG gas is stopped and the TMG gas is purged from the chamber 103. The control unit 10 decreases the number of revolutions of the rotating unit 104 to 50 rpm. The control unit 10 also sets the output of the heater 120 to zero to end the heating processing. This decreases the temperature of the substrate 101 to about 800° C. The supply of the $NH_3$ gas is then stopped at a time t13.

As described above, the control unit 10 executes the "temperature feedback control" of controlling the output of the heater 120 to cause the measurement result of the radiation thermometer 140 to have a predetermined value when the temperature set value of the substrate 101 is to be changed (between the times t1 and t2 and the times t10 and t11 in FIG. 2, for example), when the number of revolutions of the rotating unit 104 is to be changed (between the times t2 and t3 in FIG. 2, for example), when supply of a gas that affects the temperature of the substrate 101 is started (between the times t3 to t4 in FIG. 2, for example), and the like. Therefore, the substrate 101 can be set to a desired temperature even when the various parameters are changed.

The control unit 10 also executes the "constant output control" of keeping the output of the heater 120 constant at the time of film formation (between the times t4 and t5, t6 and t7, t8 and t9, and t11 and t12 in FIG. 2, for example). Accordingly, during deposition of a film, even when thin-film interference occurs depending on the film thickness, the emissivity of the wavelength measured by the radiation thermometer 140 changes, and the detection temperature of the radiation thermometer 140 changes despite the fact that the temperature of the substrate 101 does not actually change, the control unit 10 can keep the heater output constant and maintain the temperature of the substrate 101 at a predetermined value.

In this way, by controlling the output of the heater 120 while appropriately switching over the control between the two methods including the "temperature feedback control" and the "constant output control", the substrate 101 can be maintained at a predetermined temperature and a uniform film can be deposited on the substrate 101.

Furthermore, when the control method is to be switched from the constant output control to the temperature feedback control to change the temperature set value of the substrate 101, for example, when the temperature of the substrate 101 is to be changed from 1000° C. to 1100° C. between the times t10 and t11 in FIG. 2, the control unit 10 controls the output of the heater 120 to cause the detection temperature of the radiation thermometer 140 to have a value obtained by adding 100° C. (=1100° C.−1000° C.), which is a difference in the set temperature, to the indicated temperature TA1 of the radiation thermometer 140 at the time t9 without controlling the output of the heater 120 to cause the detection temperature of the radiation thermometer 140 to be 1100° C. By regarding the indicated temperature TA1 of the radiation thermometer 140 at the time t9 as 1000° C. and controlling the output of the heater 120 to cause the detection temperature of the radiation thermometer 140 to have a value of (the indicated temperature TA1 of the radiation thermometer 140 at the time t9+100° C.), the substrate 101 can be set to 1100° C. as the target value even when there is an error in the absolute value of the measurement value of the radiation thermometer 140 due to the film formation.

In the present embodiment, the temperature feedback control is executed. As cases where the temperature of the substrate 101 is likely to change, a time when the number of revolutions of the rotating unit 104 is changed, a time when supply of a gas is started, and the like are described as examples. However, cases where the temperature feedback control is to be executed are not limited thereto. For example, a time when a gas supplied to the chamber 103 is switched over, a time when the supply amount (the flow rate) of a gas to the chamber 103 is changed, a time when the pressure in the chamber 103 is changed, and the like are supposed as the cases where the temperature of the substrate 101 is likely to change. It is preferable to execute the temperature feedback control in these situations.

While measuring the temperature of the substrate 101 in the present embodiment, the radiation thermometer 140 can measure the temperature of the susceptor 102 instead.

While a silicon wafer is, for example, used as the substrate 101, the present embodiment is also applicable to cases where a film is formed on a substrate other than silicon.

The average of outputs during a time when the control is stabilized at the time of the temperature feedback control as well as the number of times of recording of the temperature when the film formation is completed are not particularly limited, and can be appropriately updated.

A case where the temperature is to be increased has been explained in the present embodiment. However, when the temperature is to be decreased, the set temperature can be obtained by subtracting a desired temperature difference from the recorded temperature.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A vapor phase growth method of growing a film on a substrate by supplying material gases to the substrate while heating the substrate with a heating unit, the method comprising:

measuring a temperature of the substrate with a radiation thermometer;

executing a first temperature feedback control to control an output of the heating unit, so that a measurement value of the radiation thermometer has a first set value which is a growth temperature of a first film, in a condition that a film is not grown on the substrate, the first film causing thin-film interference and being grown on the substrate;

executing a first constant output control to maintain an output of the heating unit constant based on a first output of the heating unit controlled so that the measurement value is the first set value by the first temperature feedback control while a first film is grown on the substrate during the first constant output control; and calculating a third set value by adding a difference between the first set value and a second set value to a measurement value of the radiation thermometer after growth of the first film, the second set value being a growth temperature of a second film which causes thin-film interference at the measuring wavelength of the radiation thermometer and being grown on the first film;

executing a second temperature feedback control, so that a measurement value of the radiation thermometer has the third set value, in a condition that a film is not grown on the substrate;

growing the second film on the first film while executing a second constant output control maintaining an output of the heating unit based on a second output of the heating unit controlled so that the measurement value is the second set value by the second temperature feedback control.

2. The method of claim 1, further comprising:

calculating a first output average value, the first output average value being an average value of the output of the heating unit during a predetermined period when the first temperature feedback control is executed; and maintaining an output of the heating unit at the first output average value when the first constant output control is executed.

3. The method of claim 1, comprising executing the first temperature feedback control at a time when a pressure in a reaction chamber in which a vapor phase growth reaction is performed is changed, at a time when gases to be supplied into the reaction chamber are switched over, at a time when a flow rate of a gas supplied into the reaction chamber is changed, or at a time when a rotation speed of the substrate is changed.

4. The method of claim 1, wherein
the first film is an aluminum nitride film, an aluminum gallium nitride film, or a gallium nitride film.

5. The method of claim 1, wherein
the first film is an aluminum nitride film or an aluminum gallium nitride film, and the second film is a gallium nitride film.

* * * * *